United States Patent
Wei et al.

(10) Patent No.: US 10,401,391 B1
(45) Date of Patent: Sep. 3, 2019

(54) LOW OVERHEAD ON CHIP SCOPE

(71) Applicant: Samsung Display Co., Ltd., Yongin-si, Gyeonggi-do (KR)

(72) Inventors: Da Wei, Urbana, IL (US); Mohammad Hekmat, Sunnyvale, CA (US); Valentin Abramzon, Mountain View, CA (US); Amir Amirkhany, Sunnyvale, CA (US)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/054,609

(22) Filed: Aug. 3, 2018

Related U.S. Application Data (60) Provisional application No. 62/635,456, filed on Feb. 26, 2018.

(51) Int. Cl.
| | | |
|---|---|---|
| H03M 3/00 | (2006.01) | |
| H03M 1/12 | (2006.01) | |
| H03F 3/387 | (2006.01) | |
| H03F 3/45 | (2006.01) | |
| H03M 1/06 | (2006.01) | |
| G01R 13/02 | (2006.01) | |

(52) U.S. Cl.
CPC ......... *G01R 13/0272* (2013.01); *H03F 3/387* (2013.01); *H03F 3/45475* (2013.01); *H03M 1/0663* (2013.01); *H03M 1/12* (2013.01); *H03M 3/46* (2013.01)

(58) Field of Classification Search
CPC ........ H03M 1/0663; H03M 1/12; H03M 3/46; H03F 3/387; H03F 3/45475; H04L 25/0272; H04L 25/4908

USPC .................. 341/122, 155; 375/340, 295, 316
See application file for complete search history.

(56) References Cited

U.S. PATENT DOCUMENTS

| | | | |
|---|---|---|---|
| 6,675,117 B2 | 1/2004 | Adam et al. | |
| 7,176,819 B1 | 2/2007 | Swerlein et al. | |
| 8,643,526 B1 | 2/2014 | Dey et al. | |
| 8,989,317 B1* | 3/2015 | Holden | H04L 25/0272 |
| | | | 375/295 |
| 9,136,942 B2 | 9/2015 | Lindsay et al. | |
| 10,003,306 B1* | 6/2018 | Larson | H03F 1/26 |
| 2006/0172783 A1* | 8/2006 | Leung | H02M 3/33515 |
| | | | 455/572 |
| 2006/0279969 A1* | 12/2006 | Leung | H02M 3/33515 |
| | | | 363/41 |

(Continued)

OTHER PUBLICATIONS

Dehlaghi, Behzad, et al. "A 12.5-Gb/s On-Chip Oscilloscope to Measure Eye Diagrams and Jitter Histograms of High-Speed Signals", IEEE, (VLSI) Systems, May 2014, pp. 1127-1137, vol. 22, No. 5.

(Continued)

*Primary Examiner* — Lam T Mai
(74) *Attorney, Agent, or Firm* — Lewis Roca Rothgerber Christie LLP (57) ABSTRACT

An on-chip scope and a method for operating the on-chip scope. The on-chip scope includes a provision for operating in one of two states, the effects of voltage offsets being different in the two states. A first voltage is measured in the first state, a second voltage is measured in the second state, and the two measurements are combined to generate a voltage estimate in which the effects of voltage offsets are reduced.

20 Claims, 3 Drawing Sheets

(56) References Cited

U.S. PATENT DOCUMENTS

| | | |
|---|---|---|
| 2011/0169480 A1 | 7/2011 | Ho et al. |
| 2012/0095713 A1 | 4/2012 | Pickerd |
| 2012/0133406 A1 | 5/2012 | Fant et al. |
| 2012/0133412 A1 | 5/2012 | Fant et al. |
| 2016/0211929 A1* | 7/2016 | Holden ............... H04L 25/4925 |
| 2017/0093280 A1 | 3/2017 | Xiao et al. |
| 2017/0131349 A1 | 5/2017 | Nemirow et al. |

OTHER PUBLICATIONS

Butta, Mattia, et al. "Low Offset Drift-Low-Noise Orthogonal Fluxgate with Synchronized Polarity Flipping", IEEE Transactions on Magnetics, Apr. 2017, 6 pages, vol. 53, No. 4.

* cited by examiner

LOW OVERHEAD ON CHIP SCOPE

CROSS-REFERENCE TO RELATED APPLICATION(S)

The present application claims priority to and the benefit of U.S. Provisional Application No. 62/635,456, filed Feb. 26, 2018, entitled "LOW OVERHEAD ON CHIP SCOPE CALIBRATION METHOD", the entire content of which is incorporated herein by reference.

FIELD

One or more aspects of embodiments according to the present invention relate to integrated circuits, and more particularly to an on-chip scope for implementation in an integrated circuit.

BACKGROUND

When debugging integrated circuits, it may be advantageous to be able to observe internal analog nodes during operation. Bringing out the internal nodes to pads may not provide useful diagnostic capabilities, however, due to the loading effect of wires and pads on the internal nodes, which may be sensitive to such loading. Circuits may be implemented in an integrated circuit to sample or amplify the signals from such nodes, before bringing the resulting signals to the exterior of the chip. Such circuits, however, may themselves load the nodes being sensed to an unacceptable extent, and they may consume unacceptable amounts of chip area or unacceptable amounts of operating power.

Thus, there is a need for a small on-chip oscilloscope that can be instantiated multiple times, requiring little chip area, and consuming little power.

SUMMARY

According to an embodiment of the present disclosure there is provided a sampling circuit, including: a sampling input; a reference input; a cross-bar switch; and a differential comparator, the cross-bar switch being connected between: the sampling input and the reference input, and the differential comparator, the cross-bar switch being configured: in a first state of the cross-bar switch, to connect: the sampling input to a first input of the differential comparator, and the reference input to a second input of the differential comparator, and in a second state of the cross-bar switch, to connect: the sampling input to the second input of the differential comparator, and the reference input to the first input of the differential comparator.

In one embodiment, the differential comparator is a clocked differential comparator having a clock input.

In one embodiment, the sampling circuit includes a multiplexer having: a select input, a plurality of value inputs, and an output, an output of the differential comparator being connected to a value input of the plurality of value inputs of the multiplexer.

In one embodiment, the sampling circuit includes a counter having: a value input connected to the output of the multiplexer, and an output, the counter being configured: to increment a count value each time a first digital value occurs at the value input, and to produce the count value at the output of the counter.

In one embodiment, the counter further has a reset input and the counter is configured to reset the count value each time the reset input is asserted.

In one embodiment, the sampling circuit includes a count comparator, the count comparator having: a first digital input, a second digital input connected to the output of the counter, and an output, the count comparator being configured to produce, at the output of the count comparator, a bit representing a result of comparing: a first non-negative integer received at the first digital input, and a second non-negative integer received at the second digital input.

In one embodiment, the sampling circuit includes a phase control circuit configured: to receive a clock signal, to receive a phase command, and to provide, to the clock input of the differential comparator, a phase-adjusted clock signal, the phase-adjusted clock signal having a phase corresponding to the phase command.

In one embodiment, the sampling circuit includes a reference voltage generator having an output connected to the reference input and configured: to receive a voltage command, and to generate a reference voltage, corresponding to the voltage command, at the output of the reference voltage generator.

In one embodiment, the sampling circuit includes a control circuit configured to: set the cross-bar switch to the first state; send a first phase command to the phase control circuit; send a first voltage command to the reference voltage generator, the first voltage command corresponding to a first reference voltage; send a first select value to the select input of the multiplexer; send a first non-negative integer value to the first digital input of the count comparator; assert the reset input of the counter; de-assert the reset input of the counter; wait for a set number of clock cycles to elapse, the set number of clock cycles being twice the first non-negative integer value; and store a first output value produced by the count comparator.

In one embodiment, the sampling circuit includes a control circuit configured to: set the cross-bar switch to the first state; send a first phase command to the phase control circuit; send a second voltage command to the reference voltage generator, the second voltage command corresponding to a second reference voltage; send a first select value to the select input of the multiplexer; send a first non-negative integer value to the first digital input of the count comparator; assert the reset input of the counter; de-assert the reset input of the counter; wait for a set number of clock cycles to elapse, the set number of clock cycles being twice the first non-negative integer value; determine that an output value produced by the count comparator is different from the first output value; and based on determining that the output value produced by the count comparator is different from the first output value, store a first estimated voltage, the first estimated voltage being: equal to the first reference voltage, equal to the second reference voltage, or between the first reference voltage and the second reference voltage.

In one embodiment, the control circuit is further configured to: set the cross-bar switch to the second state; send the first phase command to the phase control circuit; send a third voltage command to the reference voltage generator, the third voltage command corresponding to a third reference voltage; send the first select value to the select input of the multiplexer; send the first non-negative integer value to the first digital input of the count comparator; assert the reset input of the counter; de-assert the reset input of the counter; wait for the set number of clock cycles to elapse; store a third output value produced by the count comparator; set the cross-bar switch to the second state; send the first phase command to the phase control circuit; send a fourth voltage command to the reference voltage generator, the fourth voltage command corresponding to a fourth reference voltage; send the first select value to the select input of the multiplexer; send the first non-negative integer value to the first digital input of the count comparator; assert the reset input of the counter; de-assert the reset input of the counter; wait for the set number of clock cycles to elapse; determine that an output value produced by the count comparator is different from the third output value; and based on determining that the output value produced by the count comparator is different from the third output value, determine a second estimated voltage, the second estimated voltage being: equal to the third reference voltage, equal to the fourth reference voltage, or between the third reference voltage and the fourth reference voltage.

In one embodiment, the control circuit is further configured to calculate a corrected estimated voltage as one half of a difference of the first estimated voltage and the second estimated voltage.

According to an embodiment of the present disclosure there is provided a method for estimating a received voltage at a phase point in a periodic signal received at a sampling input, the phase point corresponding to a first clock phase, the method including: feeding, to a clock input of a clocked comparator, a phase-adjusted clock signal having a phase corresponding to the phase point; connecting the received voltage to a first input of the clocked comparator; connecting a reference voltage to a second input of the clocked comparator; determining a first estimated voltage; connecting the received voltage to the second input of the clocked comparator; connecting the reference voltage to the first input of the clocked comparator; determining a second estimated voltage; and calculating a corrected estimated voltage as an average of the first estimated voltage and the second estimated voltage.

In one embodiment, the determining of the first estimated voltage includes: setting the reference voltage to a first reference voltage value; determining whether the received voltage at the phase point in the periodic signal exceeds the first reference voltage value; setting the reference voltage to a second reference voltage value; determining whether the received voltage at the phase point in the periodic signal exceeds the second reference voltage value; determining that respective results, of: the determining of whether the received voltage at the phase point in the periodic signal exceeds the first reference voltage value, and the determining of whether the received voltage at the phase point in the periodic signal exceeds the second reference voltage value, are different; and based on determining that the respective results are different, setting the first estimated voltage to be: equal to the first reference voltage value, equal to the second reference voltage value, or between the first reference voltage value and the second reference voltage value.

In one embodiment, the determining of whether the received voltage at the phase point in the periodic signal exceeds the first reference voltage value includes: generating a first count, the first count being a number of times, during a first interval, that an output of the clocked comparator has a first binary value, and comparing the first count to one half of a number clock cycles elapsed during the first interval.

In one embodiment, the generating of the first count includes: resetting, at a beginning of the first interval, a counter having a value input connected to the output of the clocked comparator; and reading, at an end of the first interval, a value from an output of the counter.

In one embodiment, the connecting of the received voltage to a first input of the clocked comparator; and the connecting of the reference voltage to a second input of the clocked comparator includes setting a cross-bar switch, connected between the sampling input and a reference voltage generator, to a first state, and the connecting of the received voltage to the second input of the clocked comparator; and the connecting of the reference voltage to the first input of the clocked comparator includes setting the cross-bar switch to a second state.

According to an embodiment of the present disclosure there is provided a method for estimating a received voltage at a phase point in a received periodic signal received, from a node in a first portion of an analog circuit, at a sampling input, the phase point corresponding to a first clock phase, the method including: feeding, to a clock input of a clocked comparator, a phase-adjusted clock signal having a phase corresponding to the phase point; determining a first estimated voltage; pulling the node to a set voltage; determining a second estimated voltage; and calculating a corrected estimated voltage as a sum of: the set voltage and a difference of: the first estimated voltage and the second estimated voltage.

In one embodiment, the determining of the first estimated voltage includes: setting the reference voltage to a first reference voltage value; determining whether the received voltage at the phase point in the received periodic signal exceeds the first reference voltage value; setting the reference voltage to a second reference voltage value; determining whether the received voltage at the phase point in the received periodic signal exceeds the second reference voltage value; determining that respective results, of: the determining of whether the received voltage at the phase point in the received periodic signal exceeds the first reference voltage value, and the determining of whether the received voltage at the phase point in the received periodic signal exceeds the second reference voltage value, are different; and based on determining that the respective results are different, setting the first estimated voltage to be: equal to the first reference voltage value, equal to the second reference voltage value, or between the first reference voltage value and the second reference voltage value.

In one embodiment, the determining of whether the received voltage at the phase point in the received periodic signal exceeds the first reference voltage value includes: generating a first count, the first count being a number of times, during a first interval, that an output of the clocked comparator has a first binary value, and comparing the first count to one half of a number clock cycles elapsed during the first interval.

BRIEF DESCRIPTION OF THE DRAWINGS

These and other features and advantages of the present invention will be appreciated and understood with reference to the specification, claims, and appended drawings wherein:

DETAILED DESCRIPTION

The detailed description set forth below in connection with the appended drawings is intended as a description of exemplary embodiments of a low overhead on chip scope provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the scope of the invention. As denoted elsewhere herein, like element numbers are intended to indicate like elements or features.

Figure 1:
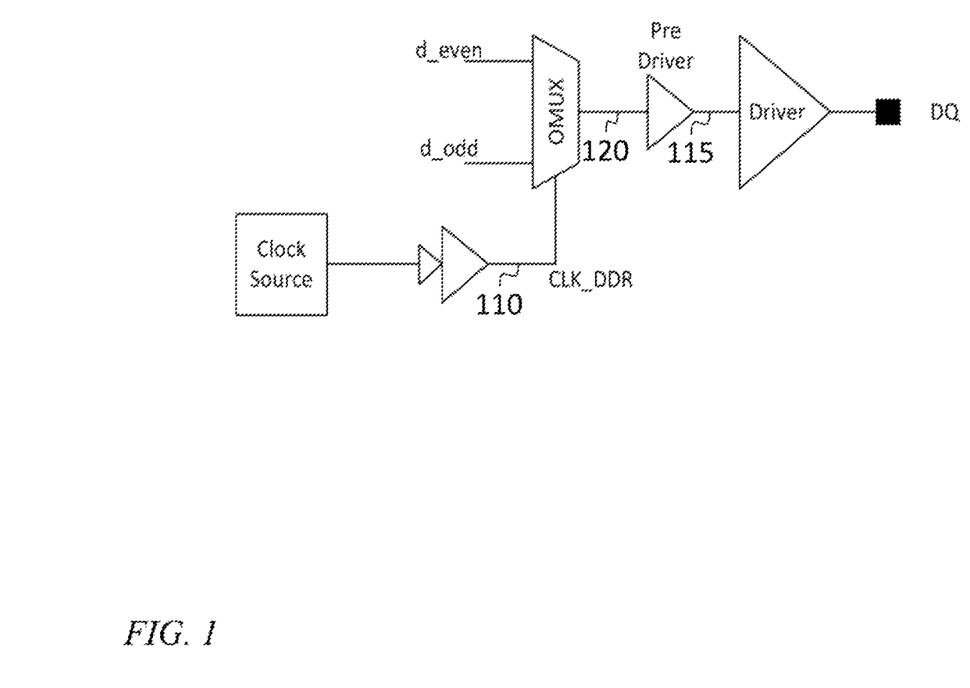
FIG. 1 is a block diagram of a serial data transmitter, according to an embodiment of the present invention.

Referring to FIG. 1, in some embodiments a double data rate serial data transmitter includes a clock source, an output multiplexer (OMUX), a pre-driver amplifier and a driver amplifier. One bit of data may be clocked out with each half-cycle of the clock, which alternately selects between the even and odd inputs of the OMUX. Such a circuit may be designed to operate at or near the greatest operating speeds achievable by the process used to fabricate the integrated circuit, and, as such, considerable effort may be devoted to designing and debugging such a circuit. For purposes of debugging, one or more on chip scopes, e.g., according to embodiments described herein, may be incorporated into the circuit of FIG. 1 and used to characterize its behavior in operation. For example, the quality and shape of the CLK_DDR signal at a clock node 110, or of signals at the pre-driver output 115 or at the OMUX output 120, may be characterized.

Figure 2:
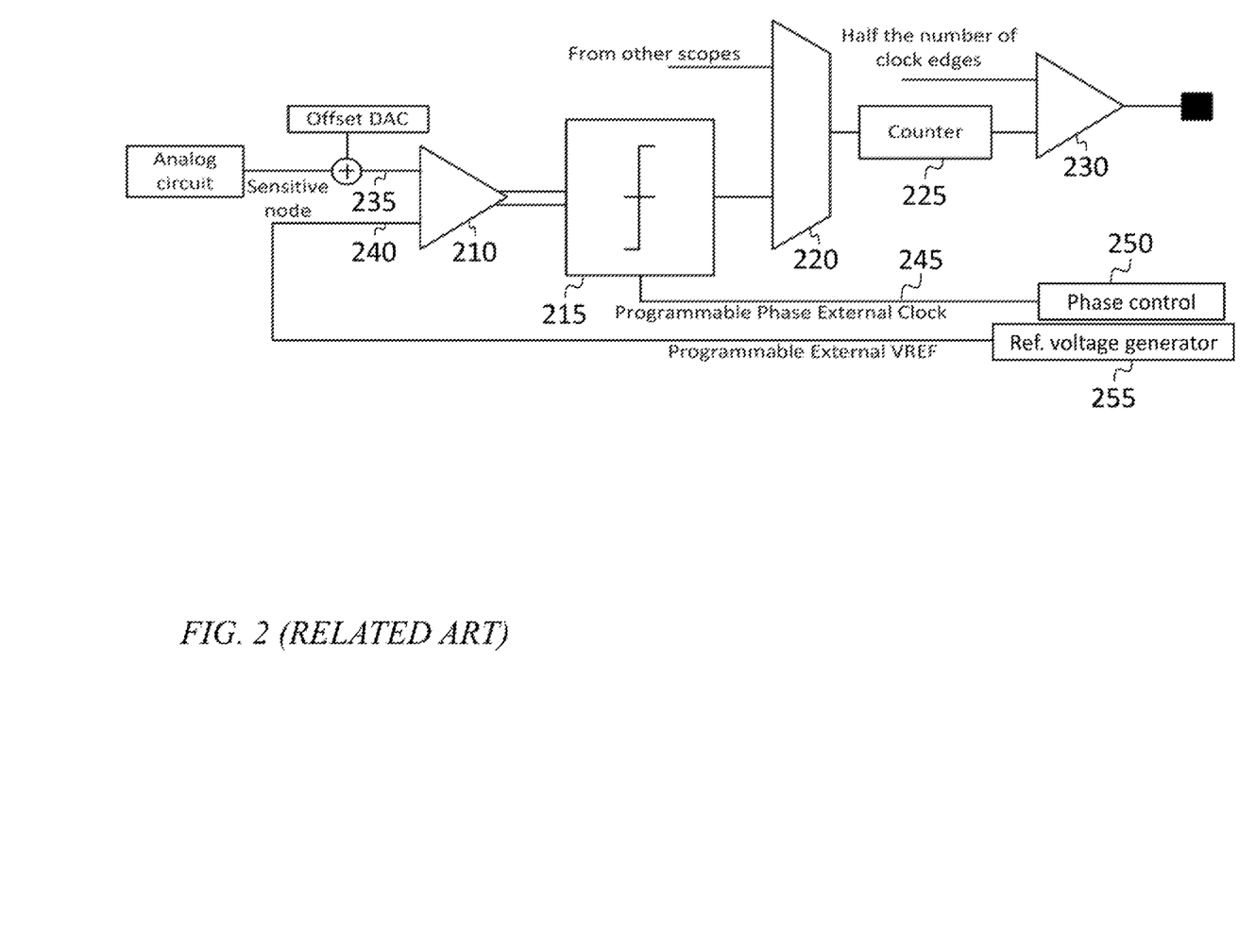
FIG. 2 is a block diagram of an on-chip scope, according to a related art embodiment.

FIG. 2 shows an on chip scope for characterizing a periodic signal (having the same frequency as a system clock) at a sensitive node, which may be referred to herein, for brevity, as the "node signal". In some embodiments, the on chip scope includes a preamplifier 210, a differential comparator 215 (which may be a differential clocked comparator (or "slicer")), a multiplexer 220, a counter 225, and a digital comparator 230. The on chip scope may have a sampling input 235 that may be connected to the sensitive node, or to the sensitive node through an offset-adding circuit (which may be a resistive adder having the sensitive node as one input and a digital to analog converter (DAC) as the other input), as shown. The preamplifier may amplify the difference between a voltage at the sampling input 235 and a reference input 240. In operation, a phase-adjusted clock signal (which may be a clock signal at the frequency of the system clock, or an integer-divided-down version of the system clock) may be fed to the clock input 245, the output of the multiplexer 220 may be fed to the counter 225 (e.g., to an input of the counter referred to herein as a "value input"), which may count the number of times the differential comparator 215 outputs a binary 1. The phase-adjusted clock signal may be generated, from the system clock (e.g., the clock source of FIG. 1) by a phase control circuit 250, which may include, for example, a phase interpolator, and which may be controlled by a system controller operating the on chip scope (e.g., the system controller may control the phase by writing values to a phase control register in the phase control circuit).

After an averaging interval, corresponding to a set number of clock cycles, has elapsed, the output of the counter may be compared, by the digital comparator 230, to a number equal to one half of the set number of clock cycles. The result of this comparison may be binary 1 if the output of the counter is greater than half of the set number of clock cycles and 0 otherwise. From this, the system controller may infer, if the result of the final comparison is 1, that the point (i.e., the point in time, or the phase point) in the node signal waveform corresponding to rising edges of the phase-adjusted clock signal has a voltage greater than the reference voltage, and, if the result of the final comparison is 0, that the point in the node signal waveform corresponding to rising edges of the phase-adjusted clock signal has a voltage less than the reference voltage. At the beginning of each averaging interval, the counter 225 may be reset by asserting a reset input of the counter 225.

The reference voltage may be supplied by a reference voltage generator 255, which may be controlled by the system controller (e.g., the system controller may control the reference voltage by writing values to a reference voltage control register in the reference voltage generator). The system controller may repeat the steps described above for various reference voltages, at a fixed phase of the phase-adjusted clock signal, to estimate the voltage at the point in the node signal waveform (e.g., by increasing the reference voltage from a low value until the result of the final comparison changes, or by performing a log search in which an initial candidate voltage range is selected (e.g., ranging from a negative supply voltage to a positive supply voltage) and in which at each iteration the midpoint of the voltage range is tested, and one half of the voltage range is eliminated (e.g., the lower half is eliminated if it is determined that the voltage at the point in the node signal waveform is greater than the midpoint voltage)). Such a sequence of tests to estimate the voltage at one point in the node signal waveform may be referred to as a "voltage sweep". In either of the two examples described above, the estimating of the voltage at the point in the node signal waveform involves finding two reference voltage values (e.g., two nearly equal reference voltage values) for which the result of the final comparison is different, and determining an estimated voltage at the phase point to be equal to one or the other of the two reference voltage values, or an intermediate value (e.g., the average of the two reference voltage values).

The system controller may repeat the voltage sweep for each of a range of phases of the phase-adjusted clock signal, to obtain a set of node signal voltages at a plurality of phase points in in the periodic node signal. As used herein, a "phase point" in a periodic signal having the same frequency as a clock signal is a point in time at which a phase-adjusted clock signal based on the clock signal transitions from low to high or from high to low. For example, the phase of the phase-adjusted clock signal may be swept in one-degree increments to obtain 360 estimates of the voltage of the node signal waveform, the estimates being uniformly spaced within the period of the node signal.

The system controller may also repeat the voltage and phase sweeps for various different sensitive nodes each of which may be connected to the multiplexer 220 in a manner analogous to the manner illustrated in FIG. 2. The three sweeps (over voltage, over phase, and over sensitive node) may be performed in the order described above, or in any other order.

Fabrication imperfections or other mechanisms may result in voltage offsets that may introduce errors into the data obtained by the on chip scope of FIG. 2. For example, the preamplifier 210 or the differential comparator 215 may have a non-zero internal offset voltage that may depend on various imperfectly controlled factors including, for example, the operating temperature or parameters of the fabrication process. As such, it may be advantageous to employ a system or method of reducing such errors. In some embodiments, this may be accomplished by including, in the analog circuit containing the sensitive node, a circuit to pull the sensitive node to a known voltage when the stage driving it is powered down, and to power down the analog circuit (or a portion of the analog circuit containing the sensitive node) on command from the system controller. The known voltage may, for example, be the common-mode voltage during normal operation, or it may be the positive supply voltage (VDD) or ground, if the reference voltage is capable of being set above VDD or below ground, respectively, and if the offset of the on chip scope when sampling VDD or ground is not substantially different from the offset when sampling the node signal.

The measurement of the waveform of the node signal may then be performed twice, once with the analog circuit operating normally, and once with the analog circuit (or the portion of the analog circuit containing the sensitive node) powered down. The latter measurement may then be a measurement of the known voltage, plus any offsets in the on chip scope. Subtracting the latter from the former and adding the known voltage may then result in a measurement of the waveform of the node signal, corrected for the offsets in the on chip scope.

Figure 3:
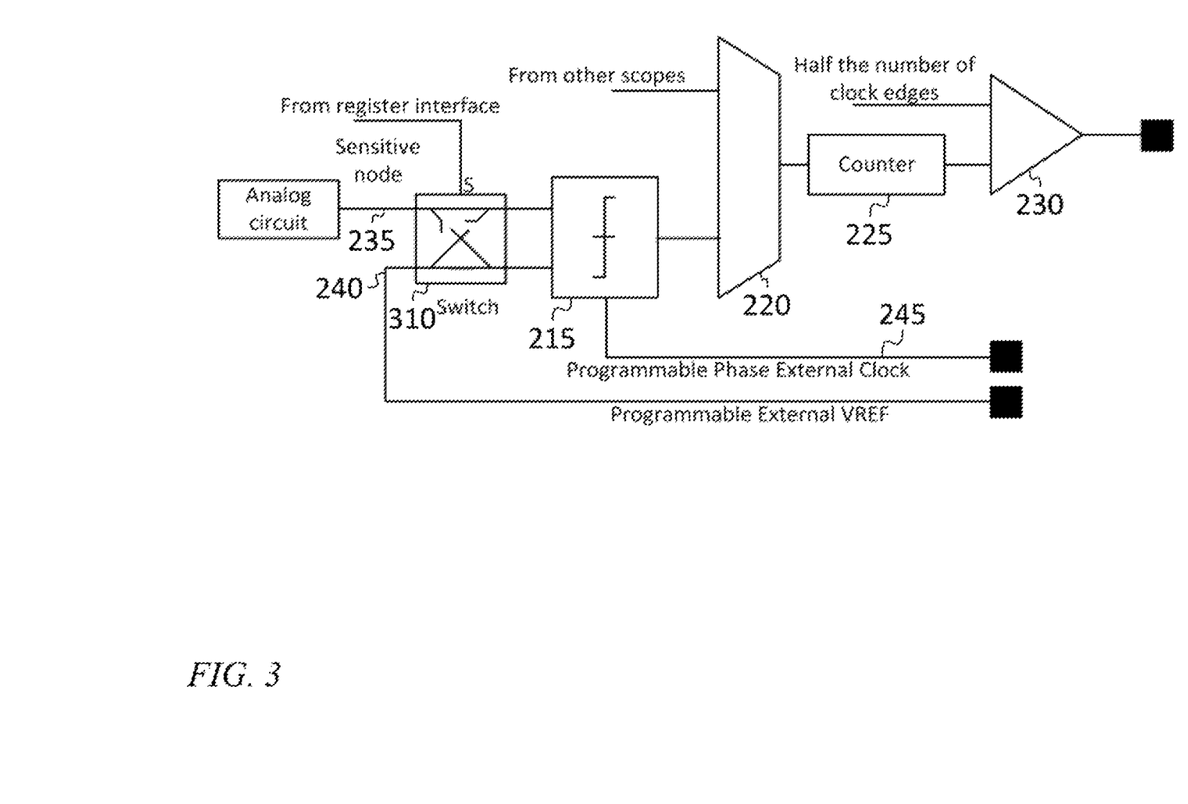
FIG. 3 is a block diagram of an on-chip scope, according to an embodiment of the present invention.

In some embodiments the effects of voltage offsets in the on chip scope may be reduced by periodically reversing connections within the on chip scope. Referring to FIG. 3, a cross-bar switch 310 is connected between (i) the sampling input 235 and the reference input 240 and (ii) the differential comparator 215. The cross-bar switch 310 is configured to operate at any time in one of two states, (i) a first state, in which the sampling input is connected to the first input of the differential comparator, and the reference input is connected to the second input of the differential comparator, and (ii) a second state, in which the sampling input is connected to the second input of the differential comparator and the reference input is connected to the first input of the differential comparator. The cross-bar switch 310 may include four transistors, each connecting one of the two inputs to one of the two outputs when turned on. The cross-bar switch 310 (like the reference voltage generator, the phase control circuit, and the multiplexer 220) may be controlled by the system controller, e.g., through registers in the integrated circuit that may be written to by the system controller. Although FIG. 3 does not show a preamplifier 210, in some embodiments a fully differential preamplifier is included in the circuit, e.g., preceding or following the cross-bar switch 310.

The waveform of the node signal is then measured twice, the second measurement is inverted (to reverse the polarity change resulting from switching the cross-bar switch 310) and the first measurement is averaged with the inverted second measurement (or, equivalently, one half of the difference of the first measurement and the second measurement is calculated). The result of this calculation is then a measurement of the waveform of the node signal, with the effects of voltage offsets in the on chip scope reduced.

The system controller may be on chip or off chip or partly on chip and partly off chip, e.g., it may include a computer writing registers on the chip to control the reference voltage generator 255, the phase control circuit 250, and the multiplexer 220, and to record the output of the count comparator at the end of each averaging interval.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed herein could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present invention". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Although exemplary embodiments of a low overhead on chip scope have been specifically described and illustrated herein, many modifications and variations will be apparent to those skilled in the art. Accordingly, it is to be understood that a low overhead on chip scope constructed according to principles of this invention may be embodied other than as specifically described herein. The invention is also defined in the following claims, and equivalents thereof.

What is claimed is:

1. A sampling circuit, comprising:
    a sampling input;
    a reference input;
    a cross-bar switch; and
    a differential comparator,
    the cross-bar switch being connected between:
        the sampling input and the reference input, and
        the differential comparator,
    the cross-bar switch being configured:
        in a first state of the cross-bar switch, to connect:
            the sampling input to a first input of the differential comparator, and
            the reference input to a second input of the differential comparator, and
        in a second state of the cross-bar switch, to connect:
            the sampling input to the second input of the differential comparator, and
            the reference input to the first input of the differential comparator.

2. The sampling circuit of claim 1, wherein the differential comparator is a clocked differential comparator having a clock input.

3. The sampling circuit of claim 2, further comprising a multiplexer having:
    a select input,
    a plurality of value inputs, and
    an output,
    an output of the differential comparator being connected to a value input of the plurality of value inputs of the multiplexer.

4. The sampling circuit of claim 3, further comprising a counter having:
    a value input connected to the output of the multiplexer, and
    an output,
    the counter being configured:
        to increment a count value each time a first digital value occurs at the value input, and
        to produce the count value at the output of the counter.

5. The sampling circuit of claim 4, wherein the counter further has a reset input and the counter is configured to reset the count value each time the reset input is asserted.

6. The sampling circuit of claim 5, further comprising a count comparator, the count comparator having:
    a first digital input,
    a second digital input connected to the output of the counter, and
    an output,
    the count comparator being configured to produce, at the output of the count comparator, a bit representing a result of comparing:
        a first non-negative integer received at the first digital input, and
        a second non-negative integer received at the second digital input.

7. The sampling circuit of claim 6, further comprising a phase control circuit configured:
    to receive a clock signal,
    to receive a phase command, and
    to provide, to the clock input of the differential comparator, a phase-adjusted clock signal, the phase-adjusted clock signal having a phase corresponding to the phase command.

8. The sampling circuit of claim 7, further comprising a reference voltage generator having an output connected to the reference input and configured:
    to receive a voltage command, and
    to generate a reference voltage, corresponding to the voltage command, at the output of the reference voltage generator.

9. The sampling circuit of claim 8, further comprising a control circuit configured to:
    set the cross-bar switch to the first state;
    send a first phase command to the phase control circuit;
    send a first voltage command to the reference voltage generator, the first voltage command corresponding to a first reference voltage;
    send a first select value to the select input of the multiplexer;
    send a first non-negative integer value to the first digital input of the count comparator;
    assert the reset input of the counter;
    de-assert the reset input of the counter;
    wait for a set number of clock cycles to elapse, the set number of clock cycles being twice the first non-negative integer value; and
    store a first output value produced by the count comparator.

10. The sampling circuit of claim 9, further comprising a control circuit configured to:
    set the cross-bar switch to the first state;
    send a first phase command to the phase control circuit;
    send a second voltage command to the reference voltage generator, the second voltage command corresponding to a second reference voltage;
    send a first select value to the select input of the multiplexer;
    send a first non-negative integer value to the first digital input of the count comparator;
    assert the reset input of the counter;
    de-assert the reset input of the counter;
    wait for a set number of clock cycles to elapse, the set number of clock cycles being twice the first non-negative integer value;
    determine that an output value produced by the count comparator is different from the first output value; and
    based on determining that the output value produced by the count comparator is different from the first output value, store a first estimated voltage, the first estimated voltage being:
        equal to the first reference voltage,
        equal to the second reference voltage, or
        between the first reference voltage and the second reference voltage.

11. The sampling circuit of claim 10, wherein the control circuit is further configured to:
    set the cross-bar switch to the second state;
    send the first phase command to the phase control circuit;
    send a third voltage command to the reference voltage generator, the third voltage command corresponding to a third reference voltage;

send the first select value to the select input of the
multiplexer;
send the first non-negative integer value to the first digital
input of the count comparator;
assert the reset input of the counter;
de-assert the reset input of the counter;
wait for the set number of clock cycles to elapse;
store a third output value produced by the count comparator;
set the cross-bar switch to the second state;
send the first phase command to the phase control circuit;
send a fourth voltage command to the reference voltage
generator, the fourth voltage command corresponding
to a fourth reference voltage;
send the first select value to the select input of the
multiplexer;
send the first non-negative integer value to the first digital
input of the count comparator;
assert the reset input of the counter;
de-assert the reset input of the counter;
wait for the set number of clock cycles to elapse;
determine that an output value produced by the count
comparator is different from the third output value; and
based on determining that the output value produced by
the count comparator is different from the third output
value, determine a second estimated voltage, the second estimated voltage being:
equal to the third reference voltage,
equal to the fourth reference voltage, or
between the third reference voltage and the fourth
reference voltage.

12. The sampling circuit of claim 11, wherein the control circuit is further configured to calculate a corrected estimated voltage as one half of a difference of the first estimated voltage and the second estimated voltage.

13. A method for estimating a received voltage at a phase point in a periodic signal received at a sampling input, the phase point corresponding to a first clock phase, the method comprising:
feeding, to a clock input of a clocked comparator, a phase-adjusted clock signal having a phase corresponding to the phase point;
connecting the received voltage to a first input of the clocked comparator;
connecting a reference voltage to a second input of the clocked comparator;
determining a first estimated voltage;
connecting the received voltage to the second input of the clocked comparator;
connecting the reference voltage to the first input of the clocked comparator;
determining a second estimated voltage; and
calculating a corrected estimated voltage as an average of the first estimated voltage and the second estimated voltage.

14. The method of claim 13, wherein the determining of the first estimated voltage comprises:
setting the reference voltage to a first reference voltage value;
determining whether the received voltage at the phase point in the periodic signal exceeds the first reference voltage value;
setting the reference voltage to a second reference voltage value;
determining whether the received voltage at the phase point in the periodic signal exceeds the second reference voltage value;
determining that respective results, of:
the determining of whether the received voltage at the phase point in the periodic signal exceeds the first reference voltage value, and
the determining of whether the received voltage at the phase point in the periodic signal exceeds the second reference voltage value,
are different; and
based on determining that the respective results are different, setting the first estimated voltage to be:
equal to the first reference voltage value,
equal to the second reference voltage value, or
between the first reference voltage value and the second reference voltage value.

15. The method of claim 14, wherein the determining of whether the received voltage at the phase point in the periodic signal exceeds the first reference voltage value comprises:
generating a first count, the first count being a number of times, during a first interval, that an output of the clocked comparator has a first binary value, and
comparing the first count to one half of a number clock cycles elapsed during the first interval.

16. The method of claim 15, wherein the generating of the first count comprises:
resetting, at a beginning of the first interval, a counter having a value input connected to the output of the clocked comparator; and
reading, at an end of the first interval, a value from an output of the counter.

17. The method of claim 16, wherein:
the connecting of the received voltage to a first input of the clocked comparator; and
the connecting of the reference voltage to a second input of the clocked comparator
comprises setting a cross-bar switch, connected between the sampling input and a reference voltage generator, to a first state, and
the connecting of the received voltage to the second input of the clocked comparator; and
the connecting of the reference voltage to the first input of the clocked comparator comprises setting the cross-bar switch to a second state.

18. A method for estimating a received voltage at a phase point in a received periodic signal received, from a node in a first portion of an analog circuit, at a sampling input, the phase point corresponding to a first clock phase, the method comprising:
feeding, to a clock input of a clocked comparator, a phase-adjusted clock signal having a phase corresponding to the phase point;
determining a first estimated voltage;
pulling the node to a set voltage;
determining a second estimated voltage; and
calculating a corrected estimated voltage as a sum of:
the set voltage and
a difference of:
the first estimated voltage and
the second estimated voltage.

19. The method of claim 18, wherein the determining of the first estimated voltage comprises:
setting the reference voltage to a first reference voltage value;
determining whether the received voltage at the phase point in the received periodic signal exceeds the first reference voltage value;

setting the reference voltage to a second reference voltage value;

determining whether the received voltage at the phase point in the received periodic signal exceeds the second reference voltage value;

determining that respective results, of:
- the determining of whether the received voltage at the phase point in the received periodic signal exceeds the first reference voltage value, and
- the determining of whether the received voltage at the phase point in the received periodic signal exceeds the second reference voltage value, are different; and based on determining that the respective results are different, setting the first estimated voltage to be:
- equal to the first reference voltage value,
- equal to the second reference voltage value, or
- between the first reference voltage value and the second reference voltage value.

20. The method of claim 19, wherein the determining of whether the received voltage at the phase point in the received periodic signal exceeds the first reference voltage value comprises:

generating a first count, the first count being a number of times, during a first interval, that an output of the clocked comparator has a first binary value, and comparing the first count to one half of a number clock cycles elapsed during the first interval.

\* \* \* \* \*